United States Patent
Althaus et al.

(10) Patent No.: US 6,731,882 B1
(45) Date of Patent: *May 4, 2004

(54) LEADFRAME-BASED OPTOELECTRONIC BIDIRECTIONAL TRANSMITTING AND RECEIVING MODULE

(75) Inventors: Hans Ludwig Althaus, Lappersdorf (DE); Klaus Panzer, Regensburg (DE); Gerhard Kuhn, Käfering (DE)

(73) Assignee: Infineon Technologies AG, Munich (DE)

( * ) Notice: Subject to any disclaimer, the term of this patent is extended or adjusted under 35 U.S.C. 154(b) by 485 days.

This patent is subject to a terminal disclaimer.

(21) Appl. No.: 09/680,038

(22) Filed: Oct. 5, 2000

(30) Foreign Application Priority Data

Oct. 5, 1999 (DE) .......................................... 199 47 889

(51) Int. Cl.⁷ ................................................ H04B 10/00
(52) U.S. Cl. ........................ 398/139; 398/135; 385/14
(58) Field of Search ................... 398/135, 139; 385/14

(56) References Cited

U.S. PATENT DOCUMENTS

| | | | |
|---|---|---|---|
| 4,733,094 A | 3/1988 | Carpentier et al. | 250/551 |
| 5,123,066 A | * 6/1992 | Acarlar | 385/14 |
| 5,400,419 A | * 3/1995 | Heinen | 385/14 |
| 6,282,000 B1 | * 8/2001 | Kikuchi et al. | 398/136 |
| 6,417,946 B1 | * 7/2002 | Krieger | 398/139 |
| 6,493,121 B1 | * 12/2002 | Althaus | 398/135 |
| 2003/0123819 A1 | * 7/2003 | Nakanishi et al. | 385/92 |

FOREIGN PATENT DOCUMENTS

| | | |
|---|---|---|
| DE | 196 40 255 A1 | 4/1998 |
| DE | 199 47 889 A1 | 5/2001 |
| EP | 0 463 214 A1 | 1/1992 |
| EP | 0 644 668 A1 | 3/1995 |
| EP | 0 664 585 A1 | 7/1995 |
| EP | 0 896 236 A2 | 2/1999 |
| EP | 0 924 540 A1 | 6/1999 |

* cited by examiner

Primary Examiner—Jason Chan
Assistant Examiner—Christina Y Leung
(74) Attorney, Agent, or Firm—Laurence A. Greenberg; Werner H. Stemer; Ralph E. Locher

(57) ABSTRACT

The transceiver module has the transmitter and receiver mounted on one side of a leadframe above light passage openings formed therein. A beam deflection receptacle, containing a fiber connection opening, at least one beam splitter and a deflection mirror, is fixed on the other side of the lead frame. The external electrical terminals of the leadframe are bent around a plastic covering and shaped out to form terminal areas, so that the module is suitable for SMT.

19 Claims, 2 Drawing Sheets

LEADFRAME-BASED OPTOELECTRONIC BIDIRECTIONAL TRANSMITTING AND RECEIVING MODULE

BACKGROUND OF THE INVENTION

FIELD OF THE INVENTION

The invention relates to a transmitting and receiving module, i.e. a transceiver module, for bidirectional optical message and signal transmission. The module includes at least one optical transmitter, at least one optical receiver, a fiber connection opening for an optical fiber, lens coupling optics, and at least one beam splitter arranged in the free beam path. In particular, the invention relates to a transmitting and receiving module which is produced in accordance with leadframe technology and can therefore be fabricated in a suitable way for surface mounting.

In fiber-optic message transmission, for some years the prior art has been, in the full-duplex or half-duplex method, to transmit at least one channel bidirectionally in each case.

For example, European patent application EP-0 463 214 describes a transmitting and receiving module, known as a BIDI module, for bidirectional optical message and signal transmission. In the case of that module, the two active components (optical transmitter and optical receiver) are incorporated as autonomous components hermetically encapsulated in a common module housing, in the hollow interior of which a beam splitter and lens coupling optics are arranged, and which has a fiber connection for a common optical fiber. By means of the transmitter, an optical signal is coupled into the connected glass fiber while, at the same time or with a time delay, a different optical signal can be received from the same fiber. The separation of the two signals is done by the beam splitter, which can also contain a WDM (wavelength division multiplexing) filter, in which one specific wavelength can be reflected and another can be let through.

If, in addition to the one channel in each case in each direction, a further channel is to be transmitted at least in one direction, then an external fiber splitter or external WDM filter can be incorporated into the feeding optical fiber, for example in front of the module. Since this constitutes a relatively impracticable solution, German patent application No. 93 114 859.7 proposes a so-called multichannel transceiver module in which, in the common housing of an above-described conventional BIDI module, at least one further optical transmitter and/or optical receiver with associated lens coupling optics, and at least one further beam splitter, are provided. The optical transmitter and/or optical receiver, or the further optical transmitter and/or optical receiver, are in that case implemented in particular in the form of the so-called TO (transistor outline) standard design, such as has also been described, for example, in German patent application No. 93 120 733.6. The use of specific housing designs such as TO or DIL proves to be relatively inflexible in practice, however, since little freedom for changes is provided. In particular, mounting techniques which are common with semiconductors for large numbers could not be used. In addition, the fixing of fiber connections such as pigtails and receptacles is relatively complicated to carry out in individual assembly.

It has already proven advantageous for transmitting and/or receiving components to be constructed in leadframe technique. This is already known per se. German patent publication DE 196 40 255 A1 describes a method for producing an electronic module having a plastic-encapsulated leadframe, in which electronic components are fitted to the not yet separated leadframes and then the populated leadframes are encapsulated in plastic in two phases. In a first injection-molding phase, the connecting webs with which the conductor tracks of the individual leadframes cohere with one another, and the leadframes themselves cohere with one another, are separated without removing material by means of the first injection mold, and then at least one extra part is inserted into a niche in the plastic body produced during the first injection-molding phase, after which the plastic body is finally encapsulated in a second injection-molding phase using a second injection mold.

European published patent application EP 0 924 540 A1 describes various embodiments of an electrooptical module mounted on a leadframe. For example, FIG. 7 discloses a leadframe with side parts which are bent over at right angles and to whose center part a retaining plate and a plug-in socket housing with a transmitting unit and a receiving unit are fitted. In the case of that module, however, the transmitting and receiving units are each assigned to dedicated fiber connections, so that at least two optical fibers always have to be connected for the transmission of information.

SUMMARY OF THE INVENTION

The object of the invention is to provide a optoelectronic bidirectional transceiver module which overcomes the above-noted deficiencies and disadvantages of the prior art devices and methods of this kind, and which enables bidirectional optical message and signal transmission on a single optical fiber. A further object of the present invention is to produce such a transmitting and receiving module as a component which can be surface mounted.

With the above and other objects in view there is provided, in accordance with the invention, a transmitting and receiving module for bidirectional optical transmission, comprising:

leadframe formed with light-passage openings, connection sections, and having first and second sides, an optical transmitter disposed at one of the light-passage openings and fixed on the first side of the leadframe;

an optical receiver disposed at another one of the light-passage openings and fixed on the first side of the leadframe;

a beam deflection receptacle formed with a fiber connection opening for receiving an optical fiber;

a beam splitter and a deflection mirror fixed on the second side of the leadframe; the the transmitter and the receiver having electrical terminals connected to corresponding the connection sections of the leadframe.

In other words, the transmitting and receiving module according to the invention has at least one optical transmitter, at least one optical receiver, a fiber connection opening for an optical fiber, lens coupling optics and at least one beam splitter arranged intermediately in the free beam path. The module is produced by the transmitter and receiver each being fixed on one side of a leadframe provided with light passage openings, in the vicinity of the light passage openings, a beam deflection receptacle containing the fiber connection opening, the beam splitter and a deflection mirror being fixed on the other side of the leadframe, and the electrical terminals of the transmitter and receiver each being connected to sections of the leadframe which are separated electrically from one another and are led to the outside as terminal pins or terminal areas.

In accordance with an added feature of the invention, the beam splitter is arranged in a free beam path between the fiber connection opening and the optical transmitter or the optical receiver.

In accordance with an additional feature of the invention, the beam deflection receptacle is a housing formed with an inner cavity, having a lateral housing end forming the fiber connection opening, and having a housing wall facing the leadframe formed with openings opposite the light passage openings in the leadframe; and the beam splitter and the deflection mirror are disposed askew in the cavity and each is arranged opposite a respective the transmitter and the receiver on one side of the light passage opening.

In accordance with another feature of the invention, the beam deflection receptacle is a modular device comprised of each the transmitter and receiver being assigned a modular unit and being fixed to the leadframe at a corresponding the light passage opening.

In accordance with a further feature of the invention, one modular unit is formed by a mirror mount containing the deflection mirror, and a further modular unit is formed by a filter-lens-receptacle unit containing the beam splitter.

In accordance with again an added feature of the invention, at least one connecting element interconnects the modular units.

In accordance with again an additional feature of the invention, a transparent submount covers a respective light passage opening and the transmitter and/or receiver is fixed to the submount.

In accordance with again another feature of the invention, a lens is fixed on a side of the submount opposite the transmitter and receiver, respectively.

In accordance with again a further feature of the invention, a lens is disposed in the beam deflection receptacle, in front of the fiber connection opening. The lens is preferably a spherical lens.

In other words, the preferred beam deflection receptacle essentially has the form of a housing with an inner cavity, whose lateral open housing end forms the fiber connection opening and which, in the housing wall that faces the leadframe, has openings which are opposite the light passage openings in the leadframe, the beam splitter or the beam splitters and the deflection mirror being set askew in the cavity, and the transmitters and receivers in each case being arranged opposite one another. The transmitters and/or receivers can each be fixed to a transparent submount that covers the light passage opening in the leadframe. A lens for focussing the beam can be fixed on that side of the submount which faces away from the transmitter or receiver. Additionally or alternatively, for this purpose a lens, in particular a spherical lens, can also be arranged in the beam deflection receptacle, in front of the fiber connection opening, so that the lens coupling optics that have already been mentioned are formed by the lenses fixed to the submounts and/or the lens arranged in the beam deflection receptacle.

In accordance with yet an added feature of the invention, the transmitter and the receiver are embedded in a plastic covering which is preferably optically opaque and is preferably injection-molded.

In accordance with yet an additional feature of the invention, the transmitters and/or the receivers are surrounded by a metallic housing molding, preferably a metallic shielding plate which, if applicable, is embedded in the plastic covering.

In accordance with a concomitant feature of the invention, the beam splitter is a wavelength-selective beam splitter.

In order to make the module capable of being surface mounted, that is to say suitable for SMT (Surface Mounted Technology), it is advantageous to embed the transmitters and receivers in a plastic covering. It is then possible for the end leadframe sections to be bent around this plastic covering in a suitable way and, on the side of the plastic covering facing away from the leadframe, to be shaped out to form larger, bearing mounting faces, with which the entire module can be soldered onto the printed circuit board in the SMT process. The plastic covering is preferably injection-molded in the injection-molding process onto the optoelectronic components mounted on one side of the leadframe. Said plastic covering preferably consists of an optically opaque plastic compound, so that at the same time optical shielding between the transmitters and receivers is achieved. In addition, metallic housing parts can be molded into the plastic covering, surround the transmitter and receiver and form an electrical shield.

Other features which are considered as characteristic for the invention are set forth in the appended claims.

Although the invention is illustrated and described herein as embodied in an optoelectronic, bidirectional transmitting and receiving module using a leadframe technique, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
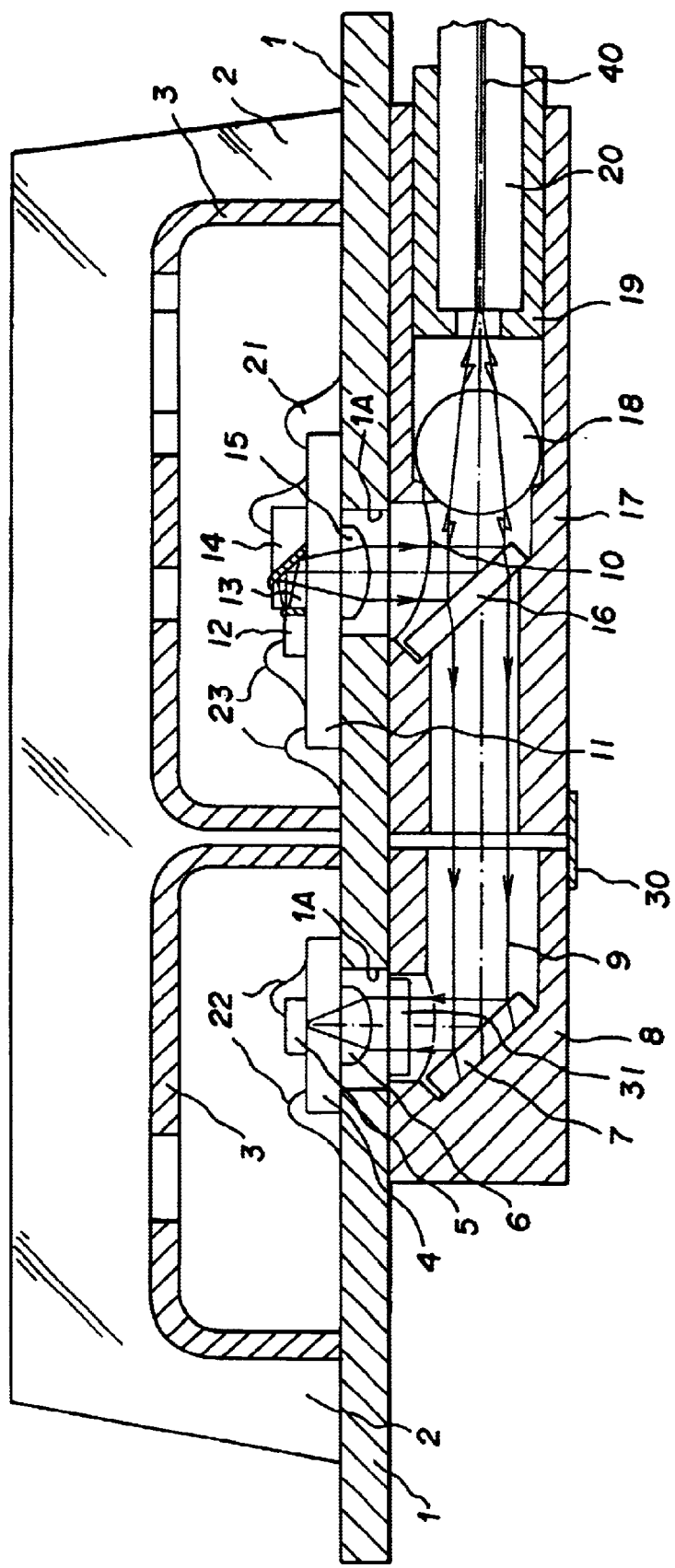
FIG. 1 is a sectional view of a first exemplary embodiment of a transmitting and receiving module according to the invention having one transmitting channel and one receiving channel.

Referring now to the figures of the drawing in detail and first, particularly, to FIG. 1 thereof, there is seen a first exemplary embodiment of a transceiver module according to the invention in a cross-sectional view. It has a transmitting channel and a receiving channel. A single optical fiber 40 is used for bidirectional, optical message and signal transmission.

The central mounting device that is used here is a leadframe 1. The leadframe 1 has a stamped profile produced in accordance with the prior art (see DE 196 40 255 A1). The individual leadframe sections initially still cohere by means of connecting webs and are only later separated from each other by severing the connecting webs. In the cross-sectional plane of the illustration, between these leadframe sections there are light passage openings 1A, through which optical radiation is guided from the optical fiber 40 to the receiver or from the transmitter to the optical fiber 40. The receiver essentially comprises a photodiode 5, which is fixed on a transparent receiver submount 4 which completely covers one light passage opening 1A and is fixed to the leadframe 1 at the corresponding edge sections of the light passage opening 1A. The transmitter essentially comprises a laser diode 12, which is fixed to a laser submount 11 which, in the same way as the receiver submount 4, is fixed on edge sections of the light passage opening 1A of the leadframe 1, completely covering the other light passage opening 1A. In the present case, the laser diode 12 is an edge emitter, which emits the laser radiation in the lateral direction into a deflection prism 13. From there, the radiation is reflected at an internal interface in the direction of the light passage opening 1A. Part of the laser radiation passes through this interface and is detected in an adjacent monitor diode 14. The photodiode 5, the laser diode 12 and the monitor diode 14 are connected to the respective leadframe sections by means of conventional bonding wires 21–23.

A beam deflection receptacle is fixed on the other side of the leadframe 1. The beam deflection receptacle is composed of a mirror mount 8 and a filter-lens-receptacle unit 17. The mirror mount 8 essentially comprises a housing and an internal cavity. On one section, the housing inner wall has a surface which is beveled at 45° with respect to the mounting face of the mirror mount 8 and on which a deflection mirror 7 is adhesively bonded or vapor-deposited. The deflection mirror 8 is intended to be 100% reflective for the received beam 9. The received beam 9 enters the mirror mount 8 in the parallel direction to the leadframe 1 through a lateral opening in the mirror mount 8 and is deflected by the deflection mirror 7 through a 90° angle and therefore falls through a further opening in the housing wall of the mirror mount 8, through the light passage opening 1A of the leadframe 1 and the transparent receiver submount 4, onto the photodiode 5. In order to improve the separation of the wavelength channels further, an additional dielectric stop filter 31 can be arranged in the housing-wall opening in the mirror mount 8, opposite the light passage opening 1A. A lens 6 is fixed on that side of the submount 4 which faces away from the receiver 4.

The mirror mount 8 is adjoined directly by the filter-lens-receptacle unit 17, which likewise essentially comprises a housing wall and an inner cavity. The unit 17, which is open on both sides, has on one side a receptacle guide sleeve 19, into which a fiber terminal pin 20 or a ferrule, in whose center the optical fiber 40 is located, can be inserted. At its opposite open end, the unit 17 is arranged directly adjacent to the mirror mount 8, so that the beam of light emerging from its cavity passes into the cavity in the mirror mount 8. In addition, the unit 17 has an opening which is arranged in one housing side wall and is opposite the light passage opening 1A in the leadframe 1. Directly underneath this opening, a beam splitter constructed as WDM filter 16 is fixed to opposing projections in the housing inner wall of the unit 17. The WDM filter 16 is built up in such a way that it reflects 100%, if possible, of the transmitting beam 10 of a first wavelength emitted by the laser diode 12, but allows through 100%, if possible, of the received beam 9 of a second wavelength. The WDM filter 16 is also arranged at a 45° angle to the mounting face of the unit 17, so that the transmitting beam 10 reflected at it is reflected at a 90° angle in the direction of the optical fiber 40. A lens 15 is fixed on the submount 11 opposite the transmitter section 12, 13, 14.

As an alternative to using two different wavelengths and a WDM filter 16, a single wavelength can also be used for the transmitting channel and the receiving channel, the WDM filter 16 being replaced by a simple beam splitter, that is to say a 3 dB beam splitter. In this case, it is merely necessary to take care that the proportion of the received beam 9 reflected at the beam splitter does not reach the active zone of the laser diode 12, which can be achieved for example by tilting the beam splitter slightly.

Between the WDM filter 16 and the receptacle guide sleeve 19 there is a spherical lens 18, with which the transmitting beam 10 can be focussed into the optical fiber 40 and the received beam 9 emerging from the optical fiber 40 can be collimated.

The beam deflection receptacle is preferably built up in modular form, that is to say the mirror mount 8 and the unit 17 are fabricated separately and integrally molded onto the leadframe 1 beside each other and fixed to each other by a connecting element 30. Instead of the beam deflection receptacle composed of the mirror mount 8 and the unit 17, however, a beam deflection receptacle comprising a single, one-piece component can also be used.

The component side of the leadframe 1 is provided with a plastic covering 2, which is preferably applied using an injection-molding process. Embedded in the plastic covering 2 are metallic shielding plates 3, which in each case surround the transmitter and the receiver and therefore shield the components electrically and optically from one another in an optimum way. In addition, an optically opaque material can be used for the plastic covering 2, so that optimum inner optical shielding is also achieved within the shielding plates 3.

In order to produce a module that can be surface mounted, it is merely necessary for the outer ends of the leadframe sections to be bent around the plastic covering 2 and to be shaped out to form mounting faces on the exposed, flat surface of the plastic covering 2. At these mounting faces, the module can then be soldered onto a printed circuit board by means of the SMT technique. However, provision can likewise be made for the module not to be designed such that it can be surface mounted and for the outer ends of the leadframe sections to be shaped to form terminal pins, which are plugged through the printed circuit board.

Figure 2:
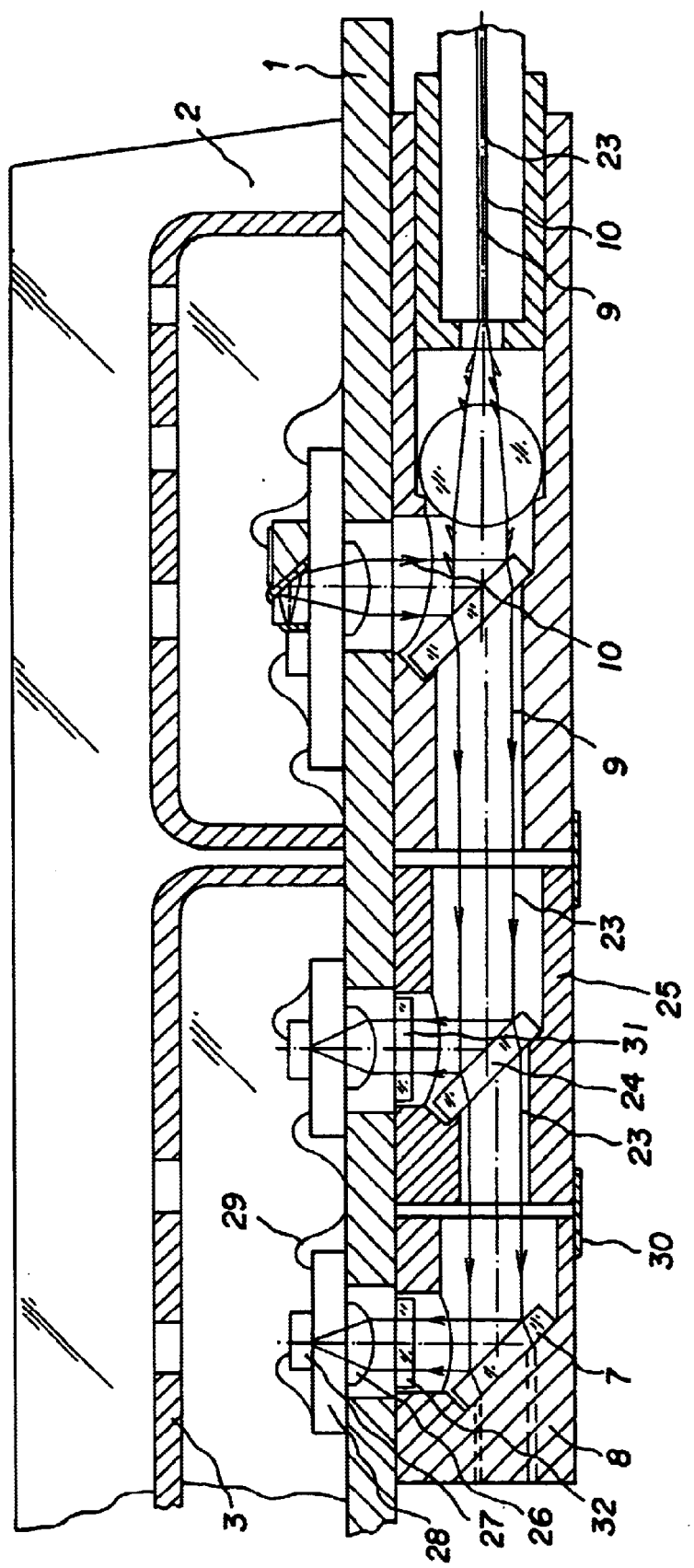
FIG. 2 is a section through a second exemplary embodiment of a transmitting and receiving module according to the invention having one transmitting channel and two receiving channels.

The second exemplary embodiment of a transmitting and receiving module according to the invention illustrated in FIG. 2 contains two receiving channels and one transmitting channel. For simplicity, in the following description essentially only those components which are modified or added with respect to the first exemplary embodiment will be described.

The additional receiver essentially comprises a photodiode 27, which is likewise mounted on a receiver submount 28 and is likewise electrically connected to corresponding leadframe sections by using terminal bonding wires 29. A receiver lens 26 can be mounted on the receiver submount 28. Likewise, a dielectric stop filter 32 can be provided in the housing-wall opening in the mirror mount 8, located opposite the corresponding light passage opening 1A.

The beam deflection receptacle is built up in modular fashion, as in the first exemplary embodiment, a filter holder 25 being inserted between the mirror mount 8 and the filter-lens-receptacle unit 17 and connected to the mirror mount 8 and the unit 17 by connecting elements 30. The filter holder 25 is fixed to the leadframe 1 in the same way as the two other subassemblies. The leadframe 1 therefore has a further light passage opening 1A, which is opposite the housing-wall opening of the filter holder 25. As already described in connection with the first exemplary embodiment in the case of the unit 17, the filter holder 25 also has a WDM filter 24 which is skewed at a 45° angle and is fixed in a suitable way to projections on the housing inner wall of the filter holder 25. If the three channels operate on three different wavelengths, then this means that the first WDM filter 16 is highly reflective at the wavelength of the transmitting beam 10, but is highly transparent at the wavelengths of the received beams 9 and 23. On the other hand, the second WDM filter 24 must be highly reflective at the wavelength of the received beam 9 but highly transparent at the wavelength of the received beam 23. Finally, the deflection mirror 7 needs to be highly reflective only at the wavelength of the received beam 23.

The configuration according to the invention can therefore be expanded virtually as desired by further transmitting and/or receiving channels. The modular construction of the beam deflection receptacle permits flexible assembly of the transmitting and receiving module according to the invention.

We claim:

1. A transmitting and receiving module for bidirectional optical transmission, comprising:
   a leadframe formed with light-passage openings, connection sections, and having first and second sides;
   an optical transmitter disposed at one of said light-passage openings and fixed on said first side of said leadframe;
   an optical receiver disposed at another one of said light-passage openings and fixed on said first side of said leadframe;
   a beam deflection receptacle fixed on said second side of said leadframe, said beam deflection receptacle being formed with a fiber connection opening for receiving an optical fiber;
   a beam splitter and a deflection mirror fixed within said beam deflection receptacle causing said fiber connection opening, said beam splitter and said deflection mirror to be disposed in a linear configuration; and
   said transmitter and said receiver having electrical terminals connected to corresponding said connection sections of said leadframe.

2. The module according to claim 1, wherein said beam splitter is arranged in a free beam path between said fiber connection opening and one of said optical transmitter and optical receiver.

3. The module according to claim 1, which further comprises lens coupling optics disposed between said fiber optics connection opening and said optical transmitter and said optical receiver, respectively.

4. The module according to claim 1, wherein
   said beam deflection receptacle is a housing formed with an inner cavity, having a lateral housing end forming said fiber connection opening, and having a housing wall facing said leadframe formed with openings opposite said light passage openings in said leadframe; and
   said beam splitter and said deflection mirror are disposed askew in said cavity and each is arranged opposite a respective said transmitter and said receiver on one side of said light passage opening.

5. The module according to claim 1, wherein said beam deflection receptacle is a modular device comprised of each said transmitter and receiver being assigned a modular unit and being fixed to the leadframe at a corresponding said light passage opening.

6. The module according to claim 5, wherein one said modular unit is formed by a mirror mount containing said deflection mirror, and a further said modular unit is formed by a filter-lens-receptacle unit containing said beam splitter.

7. The module according to claim 5, which comprises at least one connecting element interconnecting said modular units.

8. The module according to claim 1, which further comprises a transparent submount covering a respective light passage opening and fixing a respective one of said transmitter and receiver.

9. The module according to claim 8, which comprises a lens fixed on a side of said submount opposite said transmitter and receiver, respectively.

10. The module according to claim 1, which comprises a lens disposed in said beam deflection receptacle, in front of said fiber connection opening.

11. The module according to claim 10, wherein said lens is a spherical lens.

12. The module according to claim 1, wherein said transmitter and said receiver are embedded in a plastic covering.

13. The module according to claim 12, wherein said plastic covering is optically opaque.

14. The module according to claim 12, wherein said plastic covering is an injection-molded plastic covering.

15. The module according to claim 12, wherein each of said transmitter and said receiver is surrounded by a metallic shielding plate embedded in said plastic covering.

16. The module according to claim 12, wherein said connection sections of said leadframe are bent around the plastic covering and led to the outside as terminal pins or terminal areas.

17. The module according to claim 1, wherein at least one of said transmitter and said receiver is surrounded by a metallic housing molding.

18. The module according to claim 17, wherein said metallic housing molding is a metallic shielding plate.

19. The module according to claim 1, wherein said beam splitter is a wavelength-selective beam splitter.

* * * * *